(12) United States Patent
Cao et al.

(10) Patent No.: US 9,117,889 B2
(45) Date of Patent: Aug. 25, 2015

(54) 3D NANO-ELECTRO-MECHANICAL MULTIPLE-STATE CARBON NANOTUBE DEVICE STRUCTURES AND METHODS OF FABRICATION

(71) Applicant: ECOLE POLYTECHNIQUE FEDERALE DE LAUSANNE (EPFL), Lausanne (CH)

(72) Inventors: Ji Cao, Renens (CH); Mihai Adrian Ionescu, Ecublens (CH)

(73) Assignee: ECOLE POLYTECHNIQUE FEDERALE DE LAUSANNE (EPFL) (CH)

( * ) Notice: Subject to any disclaimer, the term of this patent is extended or adjusted under 35 U.S.C. 154(b) by 0 days.

(21) Appl. No.: 13/740,433

(22) Filed: Jan. 14, 2013

(65) Prior Publication Data
US 2013/0306937 A1    Nov. 21, 2013

(30) Foreign Application Priority Data
Jan. 13, 2012    (EP) .................................... 12151160

(51) Int. Cl.
*H01L 29/775*    (2006.01)
*H01L 21/02*    (2006.01)
*G11C 11/56*    (2006.01)
*G11C 13/02*    (2006.01)
*G11C 23/00*    (2006.01)
*B82Y 10/00*    (2011.01)
*H01L 29/06*    (2006.01)

(52) U.S. Cl.
CPC ............... *H01L 29/775* (2013.01); *B82Y 10/00* (2013.01); *G11C 11/56* (2013.01); *G11C 13/025* (2013.01); *G11C 23/00* (2013.01); *H01L 21/02527* (2013.01); *H01L 29/0673* (2013.01)

(58) Field of Classification Search
CPC ..................................................... H04L 29/775
USPC ............... 257/E21.501, 29; 438/51, 127, 478
See application file for complete search history.

(56) References Cited

U.S. PATENT DOCUMENTS

| 8,349,258 B2* | 1/2013 | Xu et al. ...................... 422/68.1 |
| 2006/0091440 A1* | 5/2006 | Park et al. ...................... 257/296 |
| 2010/0133511 A1* | 6/2010 | Zhou et al. ...................... 257/24 |
| 2010/0140066 A1* | 6/2010 | Feng et al. ...................... 200/181 |
| 2011/0094861 A1* | 4/2011 | Feng et al. ...................... 200/181 |
| 2013/0135320 A1* | 5/2013 | Govil et al. ...................... 345/501 |

\* cited by examiner

*Primary Examiner* — Marc Armand
(74) *Attorney, Agent, or Firm* — Sheridan Ross P.C.

(57) ABSTRACT

A 3D M-CNT structure with at least one tri-state CNT NEM switch comprising at least an electrode as a source, an electrode as a gate and an electrode as a drain, a conductive carbon nanotube which is able to take three positions depending on a voltage application to said electrodes.

7 Claims, 11 Drawing Sheets

3D NANO-ELECTRO-MECHANICAL MULTIPLE-STATE CARBON NANOTUBE DEVICE STRUCTURES AND METHODS OF FABRICATION

CROSS REFERENCE TO RELATED APPLICATION

The present application claims the benefit of the priority of European patent application Number EP 12151160.4, filed on Jan. 13, 2012 in the name of ECOLE POLYTECHNIQUE FEDERALE DE LAUSANNE (EPFL), the content of which is incorporated in its entirety by reference in the present application.

FIELD OF THE INVENTION

The present invention concerns the field of carbon nanotubes (CNT) multiple state structures and methods of fabrication of such structures.

3D M-CNT structures are proposed, in which CNTs (≥1) stack vertically as independent conducting elements for building highly-integrated multi-layer CMOS and NEMS devices. The proposed 3D M-CNT devices in the present invention offer a CMOS-compatible bottom-up approach for a broad field of potential CMOS and NEMS applications including: NEMS switches, transistors, logic devices, memory elements, pulse generators, chemical/optical/displacement/bio-sensors with functionalized CNTs, etc., with higher circuit density and novel ultra-scaled configurability functions.

The novel fabrication method as described herein offers easy process loop, symmetric switching property, and potential for developing new designs.

Other applications of the specific functionality of the M-CNT switches include: ultra-scaled reconfigurable interconnects, delay lines and so on, for logic circuits with robust performance. They can be used to produce stable and reconfigurable complex logic circuits with ultra-high circuit integration, low power consumption and low cost.

BACKGROUND OF THE INVENTION AND PRIOR ART

Carbon nanotubes (CNTs) have been intensively studied as an ideal material for building complementary metal-oxide-semiconductor (CMOS) logic circuits and nano-electro-mechanical systems (NEMS), due to their unique mechanical and electrical properties such as high Young's modulus, high current carrying capability, etc. Many CNT devices have been developed, such as: SWCNT field-effect transistor (FET) based logic gates, SWCNT memories. CNTs, especially suspended nanotubes, have many advantages in chemical, optical or displacement sensing applications as well as resonant NEMS devices. Meanwhile, their ultra-small dimension makes them the excellent candidate for future scaling down.

SUMMARY OF THE INVENTION

In the present application 3D M-CNT structures are disclosed, in which CNTs (≥1) stack vertically as independent conducting elements for building highly-integrated multi-layer CMOS and NEMS devices.

Besides, bottom up methods of fabrication are described with reproducible loop for producing each layer in the 3D devices.

In an embodiment, the invention concerns a 3D M-CNT structure with at least one tri-state CNT NEM switch comprising at least an electrode as a source, an electrode as a gate and an electrode as a drain, a conductive carbon nanotube which is able to take three positions depending on a voltage application to said electrodes.

In an embodiment, the structure may comprise more than one layer, each with at least an electrode as a source, an electrode as a gate, an electrode as a drain and a conductive carbon nanotube.

In an embodiment, at least one carbon nanotube may be mounted as a cantilever switch.

In an embodiment, at least one carbon nanotube may be clamped at its both ends.

In an embodiment, only one electrode may act as a drain and as a gate forming a two terminal switch.

In an embodiment, the electrode forming the drain and the gate may separated forming a three terminal switch.

In an embodiment, the position of CNT at the different layers may be precisely aligned with each other such that a stack of CNTs act as a channel controlled by common lateral gates or by common gate all around, in order to increase the equivalent density of a CNT FETs with enhanced on current and performance.

In an embodiment the invention concerns an electronic device comprising a structure as defined herein.

In an embodiment the invention is about a method for producing a 3D CNT structure, wherein the method comprises the following steps:
(a) a photoresist is coated on a substrate with pre-patterned guiding electrode pairs;
(b) trenches are defined between each guiding electrode pair;
(c) a CNT solution is cast onto the sample surface and ac-dielectrophoresis 35 is applied between the guiding electrodes such that CNTs are attracted and trapped into the trenches;
(d) a further ebeamresist layer is coated;
(e) lateral gates and CNT clamp on top of the source electrode are defined by EBL and deposited by metal evaporation;
(f) the structure is released by stripping the resist and dried to avoid surface tension.

In an embodiment steps (a) to (e) may be repeated a predetermined number of times.

In an embodiment the predetermined number of times is equal to 0, 1, 2 or more.

In an embodiment the invention is about a method for producing a vertical 3D CNT structure, wherein the method comprises the following steps
(a) a thick ebeamresist layer is coated on a substrate with pre-patterned guiding electrode pairs;
(b) small windows or trenches are defined on top of the resist layer and the exposed resist is be dissolved exposing underlying small regions of the guiding electrodes;
(c) a CNT solution is cast onto the sample surface and ac-dielectrophoresis is applied between the guiding electrodes such that CNTs are attracted and trapped into the vertical deep trenches;
(d) electroplating is applied to the guiding electrodes and metal clamps are deposited in the deep trenches connecting the CNTs and the guiding electrodes;
(e) the structures are released by stripping the resists and being dried in a critical point drier to avoid the surface adhesion;
(f) misaligned CNTs and impurities are lifted off;

In an embodiment, the methods described herein are used fabricate field emission displays, CNT NEM switches (with vertically deposited actuation electrodes or CNTs), vertical CNT field effect transistors.

In an embodiment, the methods are applied to nanowire or graphene flakes.

BRIEF DESCRIPTION OF THE DRAWINGS

FIGS. 7(a) to 7(j) illustrates an embodiment of a fabrication process with reproducible loop for producing each layer in the 3D M-CNT devices.

FIG. 7(a') illustrates a substrate with a thick ebeamresist layer;

FIG. 7(c') illustrates the substrate of FIG. 7(b') with a small windows/trenches defined on the top of the resist layer;

FIG. 7(d') illustrates the substrate of FIG. 7(c') with CNT solution trapped into the small windows/trenches;

FIG. 7(e') illustrates the device FIG. 7(d') with the resists stripped;

FIG. 7(f') illustrates the device of FIG. 7(e') being released;

FIG. 10 illustrates the first layer of a three terminal cantilever M-CNT switch

DETAILED DESCRIPTION OF THE INVENTION

Figure 1A:
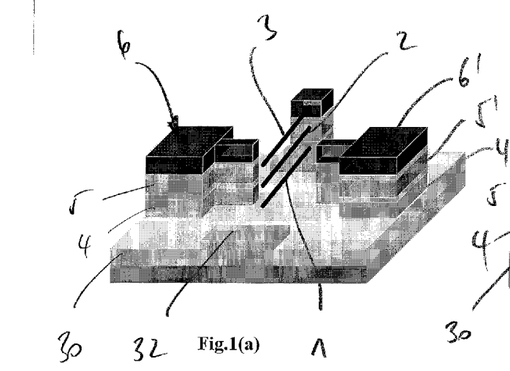
FIG. 1a illustrates a two-terminal 3D M-CNT cantilever switches.
Figure 1B:
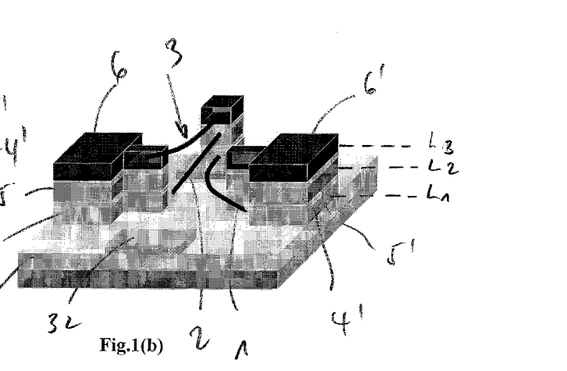
FIG. 1b illustrates the working principle of a 3D M-CNT cantilever switches.
Figure 2:
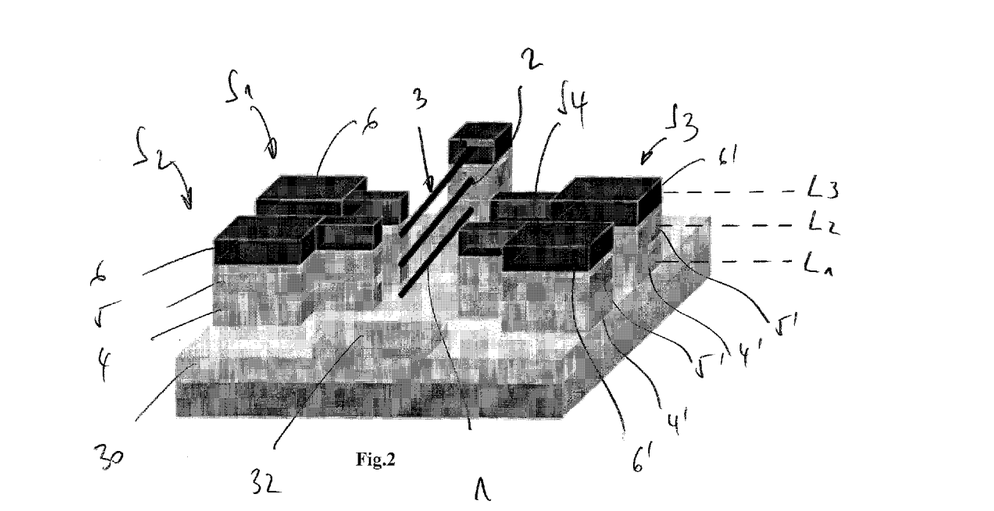
FIG. 2 illustrates a two-terminal 3D M-CNT cantilever switches.
Figure 3A:
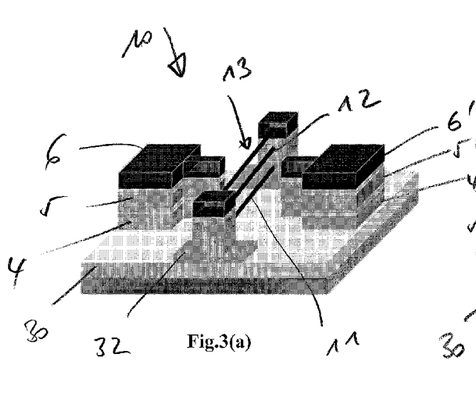
FIG. 3(a) illustrates a two-terminal 3D M-CNT clamped-clamped switch.
Figure 3B:
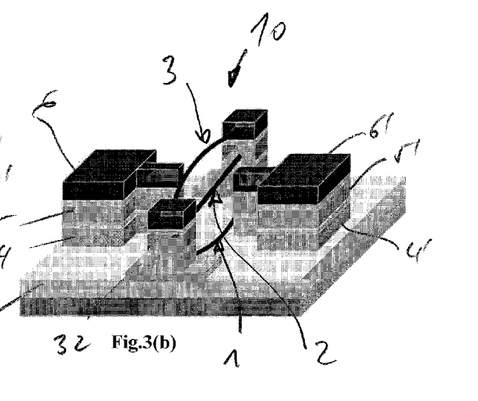
FIG. 3(b) illustrates the working principle of a 3D M-CNT clamped-clamped switch.
Figure 4A:
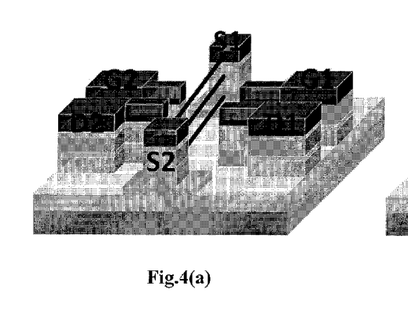
FIG. 4(a) illustrates a three-terminal 3D M-CNT clamped-clamped switches.
Figure 4B:
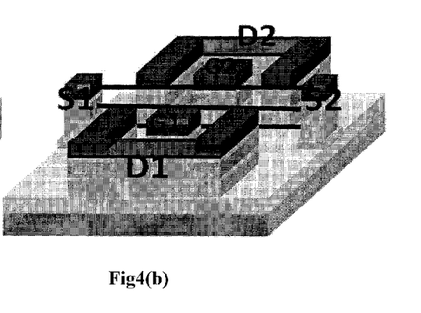
FIG. 4(b) illustrates the working principle of a three-terminal 3D M-CNT clamped-clamped switches.
Figure 5A:
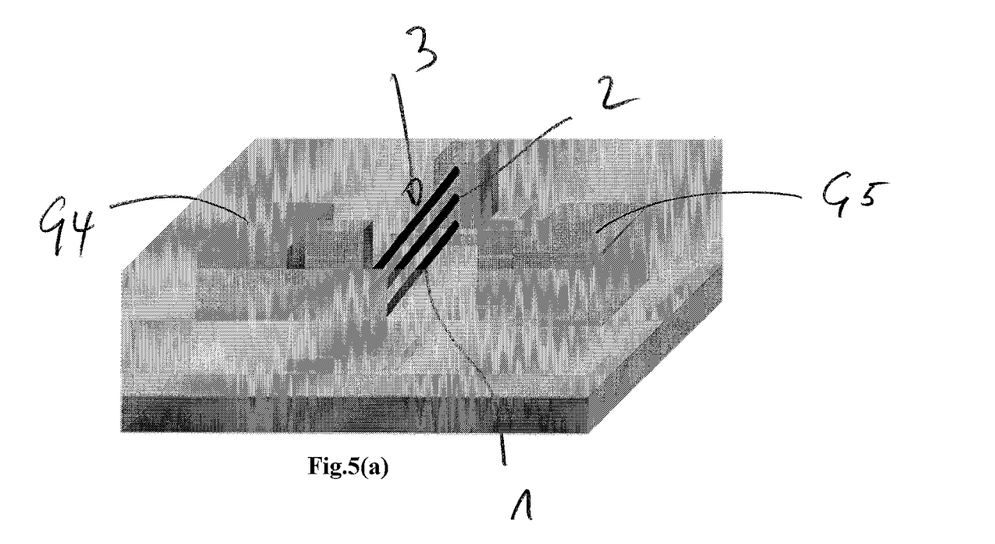
FIG. 5(a) illustrates an example of a dense 3D CNT transistor stack with solid gate dielectrics.
Figure 5B:
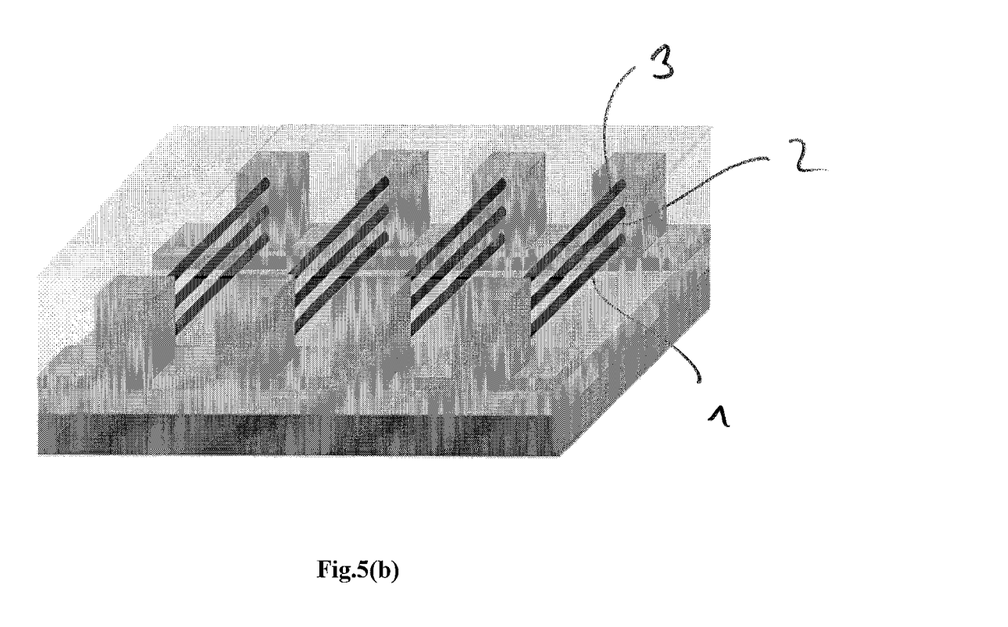
FIG. 5(b) illustrates another example of a dense 3D CNT transistor stack with solid gate dielectrics.
Figure 6:
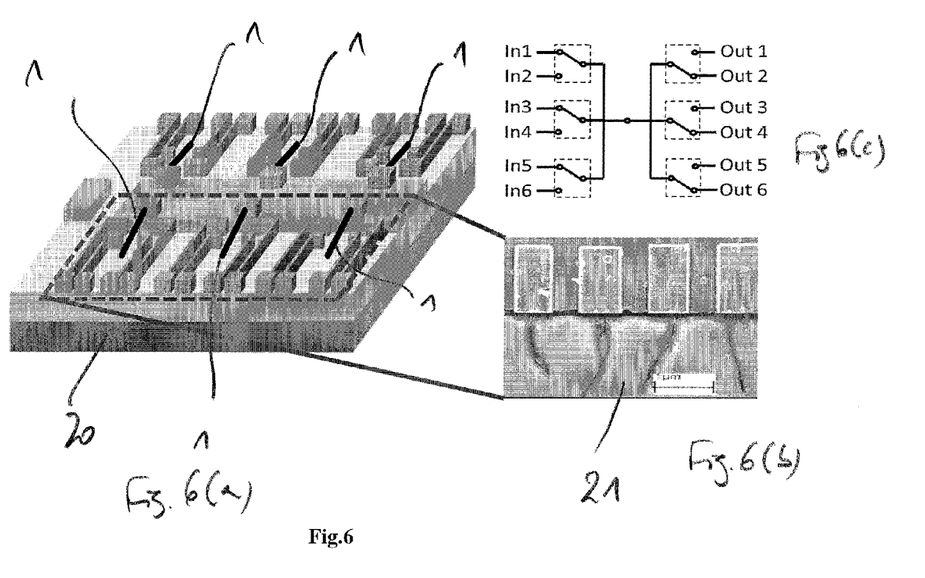
FIG. 6(a) illustrates a large scale 3D multiplexer and demultiplexer.
FIG. 6(b) illustrates a SEM pictures of a CNT arrays of a large scale 3D multiplexer and demultiplexer.
FIG. 6(c) illustrates a multiplexer-demultiplexer architecture.
Figure 7:
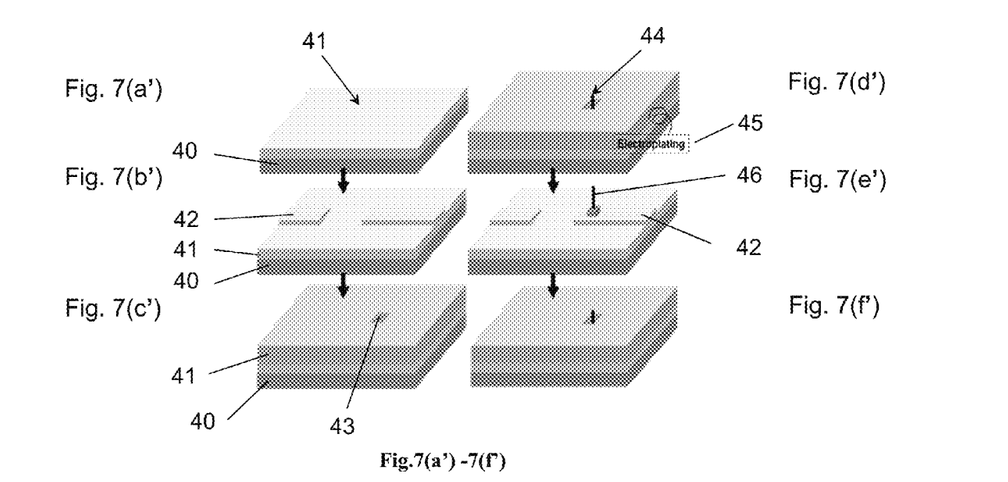
FIG. 7(a) illustrates a SiO$_2$/Si substrate.
FIG. 7(b) illustrates the substrate of FIG. 7(a) with pre-patterned guiding electrode pairs.
FIG. 7(c) illustrates the substrate of FIG. 7(b) coated with a eabeamresist layer.
FIG. 7(d) illustrates the substrate of FIG. 7(c) with a trenches defined by defined by e-beam lithography.
FIG. 7(e) illustrates a CNT solution casted onto the surface of the device of FIG. 7(d)
FIG. 7(f) illustrates the device of FIG. (e) with CNTs trapped into the trenches.
FIG. 7(g) illustrates the substrate of FIG. 7(f) coated with a further eabeamresist layer and lateral gates and clamps defined.
FIG. 7(h) illustrates the substrate of FIG. 7(g) after coating by metal evaporation and stripping of the resist.
FIG. 7(i) illustrates a 1 layer device.
FIG. 7(j) illustrates a 3 layer device.
Figure 8A:
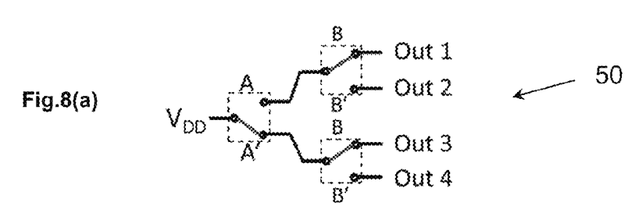
FIG. 8(a) illustrates a customized implementation of a decoder circuit.
Figure 8B:
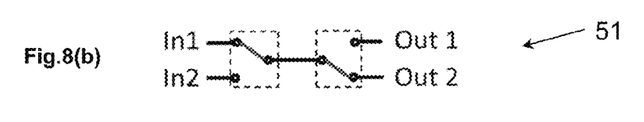
FIG. 8(b) illustrates an embodiment of a specific cross bar switch matrix.
Figure 9:
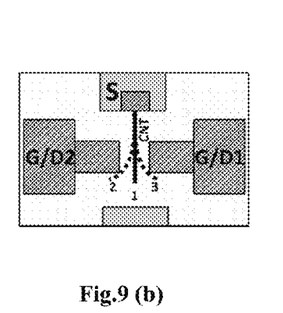
FIG. 9(a) illustrates a 3D structure example of a first layer of a two terminal cantilever M-CNT switch.
FIG. 9(b) illustrates an exemplary layout with the three position of a two terminal cantilever M-CNT switch.
FIG. 9(c) illustrates a SEM image of the first layer of the two terminal cantilever M-CNT switches.
Figure 9A:
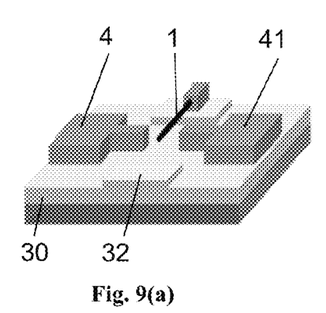
Figure 10A:
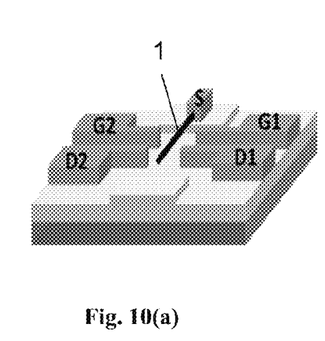
FIG. 10(a) illustrates a 3D structure example of the first layer of a three terminal cantilever M-CNT switch.
Figure 10B:
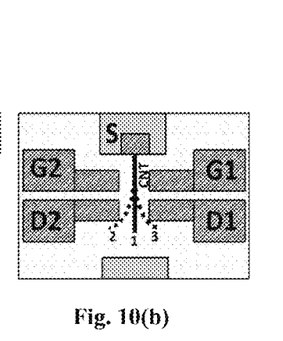
FIG. 10(b) illustrates an exemplary layout of the first layer of a three terminal cantilever M-CNT switch.
Figure 10C:
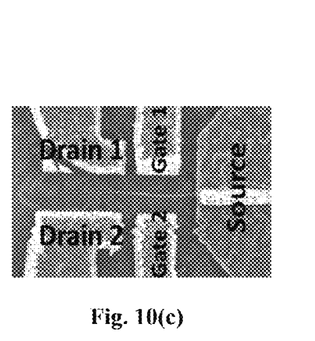
FIG. 10(c) illustrates a SEM image of the first layer of a three terminal cantilever M-CNT switch.
Figure 12:
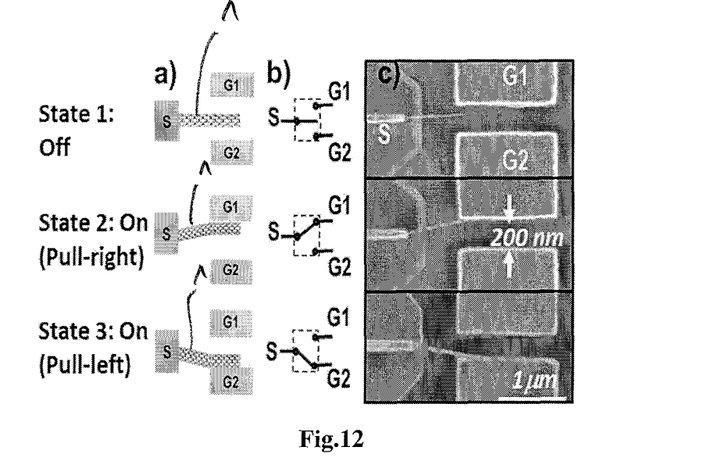
FIG. 12 illustrates three mechanical states of a two-terminal cantilever switches without stiction.

FIG. 1 illustrates a 3D embodiment and one operation mode of two-terminal 3D M-CNT cantilevered switches;

FIG. 2 illustrates a 3D embodiment of three-terminal 3D M-CNT cantilevered switches;

FIG. 3 illustrates
(a) a 3D embodiment and
(b) one operation mode of two-terminal 3D M-CNT clamped-clamped switches;

FIG. 4 illustrates 3D embodiments of three-terminal 3D M-CNT clamped-clamped switches with two gate/drain configurations (a) and (b);

FIG. 5 illustrates
(a) an embodiment of a 3D CNT transistor stack with solid gate dielectrics with lateral gates;
(b) an embodiment of a dense 3D CNT transistor stack with solid gate dielectrics controlled by common gate all around;

FIG. 6 illustrates an embodiment, an operation mode and SEM images of the first layer of the 3D multiplexer and demultiplexer;

FIG. 7 (a-j) illustrates a fabrication process with reproducible loop for producing each layer in the 3D M-CNT devices. (a'-f') extended process flow for fabricating vertical CNT devices;

FIG. 8 illustrates embodiments of tri-state CNT NEM switches used as:
a) a 2×4 decoder or reconfigurable interconnect and
b) a crossbar switch matrix in logic circuits;

FIG. 9 illustrates a 3D structure embodiment, a layout and a SEM image of the first layer of two terminal cantilever M-CNT switches;

FIG. 10 illustrates a 3D structure embodiment, a layout and a SEM image of the first layer of the three terminal cantilever M-CNT switches;

FIG. 11 illustrates
(a-c) a 3D structure embodiment, a layout and a SEM image of the first layer of the two terminal clamped-clamped M-CNT switches;
(d-f) a 3D structure embodiment, a layout and a SEM image of the first layer of the three terminal clamped-clamped M-CNT switches;

FIG. 12 illustrates three mechanical states of cantilever M-CNT NEM switches where the suspended CNT-lever is 500 nm long:
a) schematic,
b) symbol, and
c) SEM images.

Figure 13:
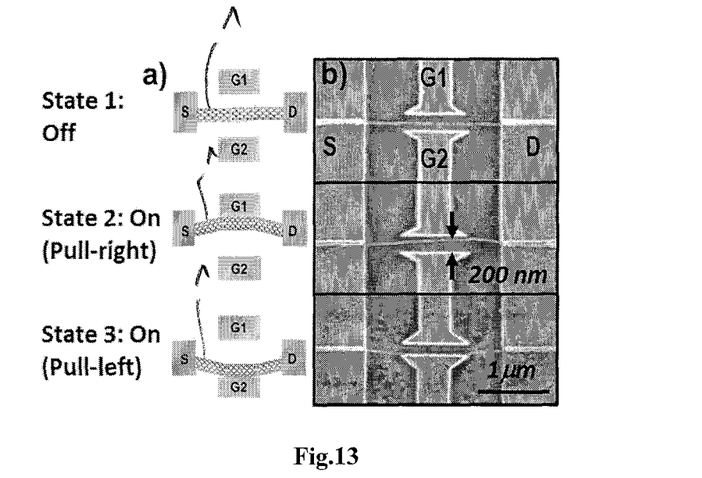
FIG. 13 illustrates three mechanical states of a clamped-clamped M-CNT NEM switches without stiction.

FIG. 13 illustrates three mechanical states of clamped-clamped M-CNT switches where the suspended CNT beam is 1.5 μm long:
a) schematic and
b) SEM images.

Figure 14:
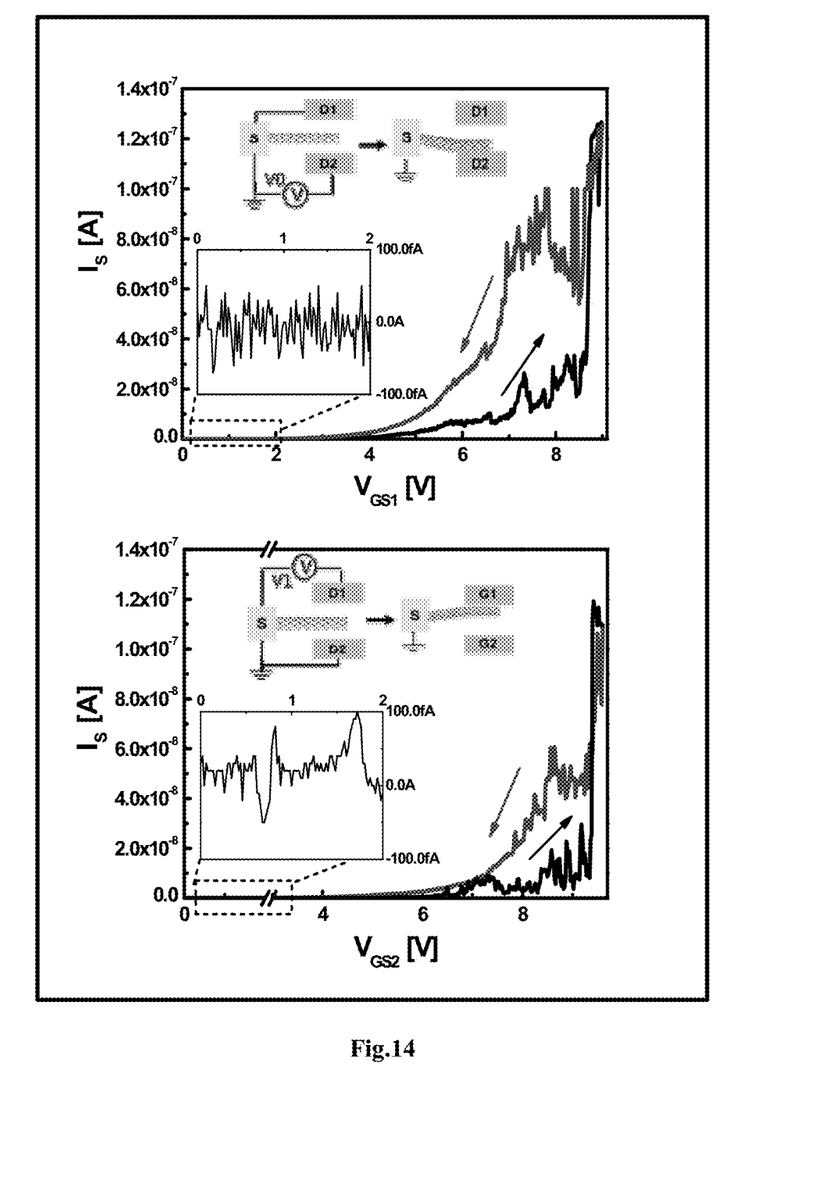
FIG. 14 illustrates the typical switching characteristics of the cantilever M-CNT switches.
Figure 15:
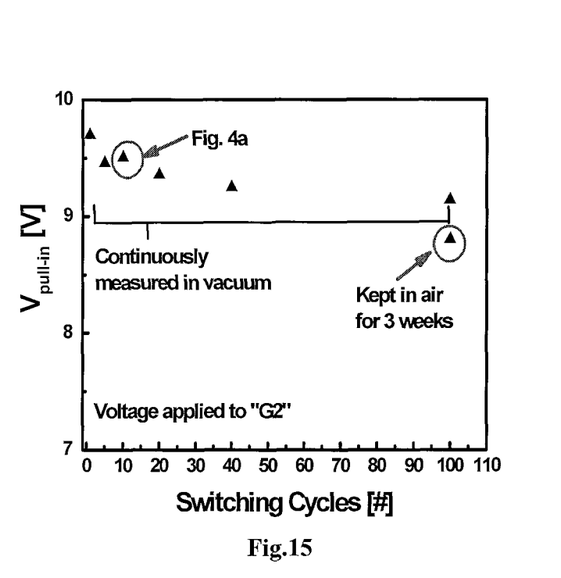
FIG. 15 illustrates the results for a typical device.
Figure 16:
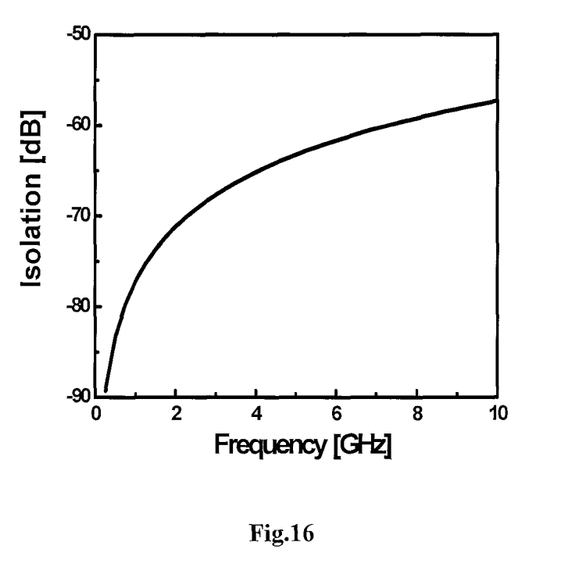
FIG. 16 illustrates a HFSS simulation up to 10 GHz.
Figure 17:
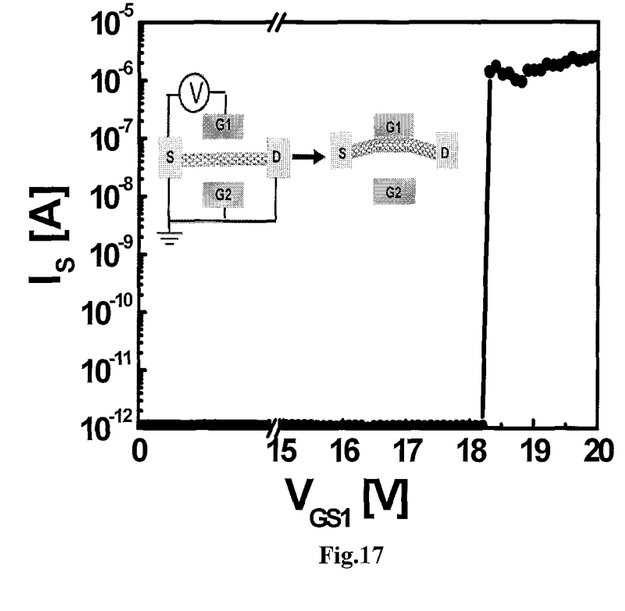
FIG. 17 illustrates the actuation measurement of the clamped-clamped M-CNT switch.

FIG. 14 illustrates a Hysteretic I-V characteristic for a M-CNT switch, while flip-flopping between "State 1" and "State 2"/"State 3" (a and b). The insets (down) show the ultra-low leakage currents in "OFF" state;

FIG. 15 illustrates endurance characteristics of the same switch as in FIG. 14. The operation over 100 cycles is guaranteed;

FIG. 16 illustrates isolation of the cantilever M-CNT switches up to 10 GHz simulated by HFSS;

FIG. 17 illustrates an actuation measurement of the clamped-clamped M-CNT switch shown in FIG. 1f', while switching from "State 1" to "State 2".

1.1 3D Multiple-State CNT (M-CNT) Switch Structures

As a basic components of CNT-based NEMS circuits, two-terminal CNT switch and three-terminal CNT relay, in which a conducting carbon nanotube is electrostatically deformed to close an electric circuit, have been investigated experimentally and theoretically.

The conventional CNT NEM switches remain the bi-state configuration since they were proposed in 2002, which operate in "ON" and "OFF" states. The traditional CNT switches operate mechanically in a vertical plane where the movable CNT-levers or CNT-beams get contacted with/detached from the gate/drain electrodes on the ground plane. This bi-state vertical structure becomes a major obstacle to build large scale integrated circuits with individual access to each device. Moreover, precise control on the gap between the suspended CNT (tip) and the gate/drain electrodes is critical in vertical switches. For too small gaps, CNT will connect the gate/drain electrodes before any voltage is applied; for too large gaps, too high pull-in voltage will be required. However, currently no accurate bottom-up assembly methods have successfully addressed this issue. Therefore it is highly desirable to explore new device architectures, such as laterally actuated 3D CNT switches, which could solve the problems.

Various types of multiple-state CNT (M-CNT) switches: cantilever and clamped-clamped M-CNT switches with multiple gates are disclosed herein as embodiments of the present invention and illustrated in the attached figures.

In each layer of the multilayer M-CNT switch, there are formed of one CNT and dual lateral gates sub-100 nm away from the CNT. The M-CNT switch in each layer operates in three states:
CNT in the center (OFF),
CNT attracted to the left gate (ON-1) or
CNT attracted to the right gate (ON-2).

Therefore, for n layer M-CNT, there are 3n multiple states. They are applicable for large scale integration with ultra-high equivalent density. Materials such as single-walled CNTs, multi-walled (MW) CNTs and nanowires can be applied here in embodiments of the present invention.

1.1.1 3D M-CNT Cantilever Switches
1.1.1.1 Two-Terminal 3D M-CNT Switches

FIG. 1a illustrates an embodiment of a two-terminal 3D M-CNT cantilever switches. FIG. 1b shows the working principle of the M-CNT switches.

In each layer L1-L3, there is an independent Tri-state CNT NEM switch CNT 1, 2, 3 operating independently. Electrodes 4, 4', 5, 5', 6, 6' of different layers are isolated. Actuation voltages can be applied to either electrode 4-6' in each layer L1-L3 to control the switching states of the switches 1-3.

For example, in FIG. 1b, we apply actuation voltages to the right electrode 4' in the first layer L1 and the left electrode 6 in the third layer L3. Therefore, the states of the switches 1-3 in each layer L1-L3 are: in the first layer L1, the switch 1 is ON-1, with a current path between the clamp C1 of CNT and the right electrode 4'; in the second layer L2, the switch 2 is OFF with an isolated CNT C2; in the third layer L3, the switch 3 is ON-2, with a current path between the clamp electrode C3 and the left electrode 6.

As a result, in one 3D device, 3*3*3=27 operation state combinations can be set.

3D M-CNT switches are promising candidate for higher density logic circuits with reconfigurable functionality.

1.1.1.2 Three-Terminal M-CNT Switches

For a two-terminal CNT NEM switch, only one electrode 4, 4', 5, 5', 6, 6' acts as both as drain ("D") and gate ("G"); while for a three terminal CNT switch, gate and drain electrodes are separated. The gate controls the switching states, and the drain bias determines the drain current. Advanced three-terminal structures can be realized by splitting all the G/D electrode 4, 4', 5, 5', 6, 6' stacks in FIG. 1a into independent G and D electrode stacks S1, S2, S3 and S4 in the 3D M-CNT switches as in FIG. 2 which comprise the same electrode configuration 4, 4', 5, 5', 6, 6' as illustrated in FIGS. 1(a) and 1(b) but in two.

Three-terminal structures offer more flexibility of device operation for more complex applications, such as memories and logic circuits. Meanwhile, the working current and power can be greatly reduced by applying independent low drain voltages. Lifetime of the M-CNT can be greatly prolonged.

FIG. 2 illustrates a three-terminal M-CNT 1, 2, 3 cantilever switch in accordance with the principle of the invention.

Basic work principle of the device structure is similar to the device in FIGS. 1a and 1b. The only difference is that the actuation electrodes S1 and S3 and the contacting electrodes S2 and S4 are separated. In this case, the actuation electrodes S1 and S3 will control the position of the CNT 1, 2, 3, deciding the current path; current level is decided by the contacting electrodes S2 and S4 and there is no current through the actuation electrode. Therefore, we can apply low voltage to the contacting electrodes S2 and S4 and apply higher bias to attract the CNT 1, 2, 3. Low power consumption is one of the major advantages of this kind of device.

1.1.2 3D M-CNT Clamped-Clamped Switches:

By fixing both ends of the CNTs, we can fabricate the 3D M-CNT clamped-clamped switches 10, which the position and shape and length of the CNT bodies could be better controlled, as illustrated in FIGS. 3(a) and 3(b).

FIG. 3(a) illustrates an embodiment of a two-terminal 3D M-CNT clamped-clamped switch 10. FIG. 3(b) shows the working principle of the 3D M-CNT clamped-clamped switch 10. The working principle is similar to the one described above with reference to FIGS. 1(a) and 1(b).

FIGS. 4a and b illustrate embodiments of the three-terminal 3D M-CNT clamped-clamped switches with different source ("S"), drain ("D") and gate (G") patterns S1, S2, G1, G2, D1 and D2. The working principle is similar to the one made above with reference to preceding embodiments.

1.2 More Related Structures and Applications

Based on the M-CNT switches as described herein (see FIGS. 1(a) to 4(b)), more devices could be developed similarly using the same principle, such as: dense 3D CNT transistor stack with solid gate dielectrics (gate-all-around with ALD) as shown in FIGS. 5(a) and (b).

The position of CNTs 1, 2, 3 at the different layers are precisely aligned with each other. 3D stack of CNTs act as the channels controlled by common lateral gates G4, G5 (see FIG. 5a) and by common gate all around (FIG. 5b), aiming at increasing the equivalent density of the CNT FETs with enhanced on current and performance.

Large scale 3D multiplexer and demultiplexer can also be made using the principle of the invention. The first layer 20 of the 3D multiplexer and demultiplexer is shown in FIG. 6(a)/6(c) including the demonstrated SEM pictures 21 of the CNT arrays (FIG. 6(b)). The position of the CNT and further the state of the switch are controlled similarly to Section 1.1.1.2 above. The CNT 1 cantilevers can also be replaced by clamped-clamped CNTs.

FIG. 6(c) illustrates the multiplexer-demultiplexer architecture.

FIGS. 7(a) to 7(j) illustrates an embodiment of a fabrication process with reproducible loop for producing each layer in the 3D M-CNT devices.

FIG. 7(a') to 7(f') illustrate an embodiment of an extended process flow for fabricating vertical CNT devices.

Bottom up methods of fabrication are illustrated with reproducible loop for producing each layer in the 3D M-CNT devices.

The fabrication process based on a nanoscale precision assembly technique is depicted and described hereunder.

First, for example, a 140 nm photoresist 31 (for example: LOR)/50 nm ebeamresist (for example: PMMA) are coated on a SiO$_2$/Si substrate 30 with pre-patterned guiding electrode pairs 32 (see FIG. 7a-c).

For cantilever M-CNT structures, 4 um long, 50 nm wide trenches 33 are defined by e-beam lithography (EBL) between each guiding electrode pair. The guiding electrodes in the pair are referred to as "source" and "drain". The trenches 33 extended from the surface of source electrode to the center of the gap between source and drain (see FIG. 7d).

Then, a CNT solution 34 is cast onto the sample surface and ac-dielectrophoresis 35 is applied between the guiding electrodes 32 electric-field forces, CNTs 36 are attracted and trapped into the trenches (see FIG. 7e-f).

A second ebeamresist layer is coated. The lateral gates 37 and the CNT clamp 38 on top of the source electrode 32 are defined by EBL and deposited by metal evaporation (see FIG. 7g-h).

Figures 7A, 7J:
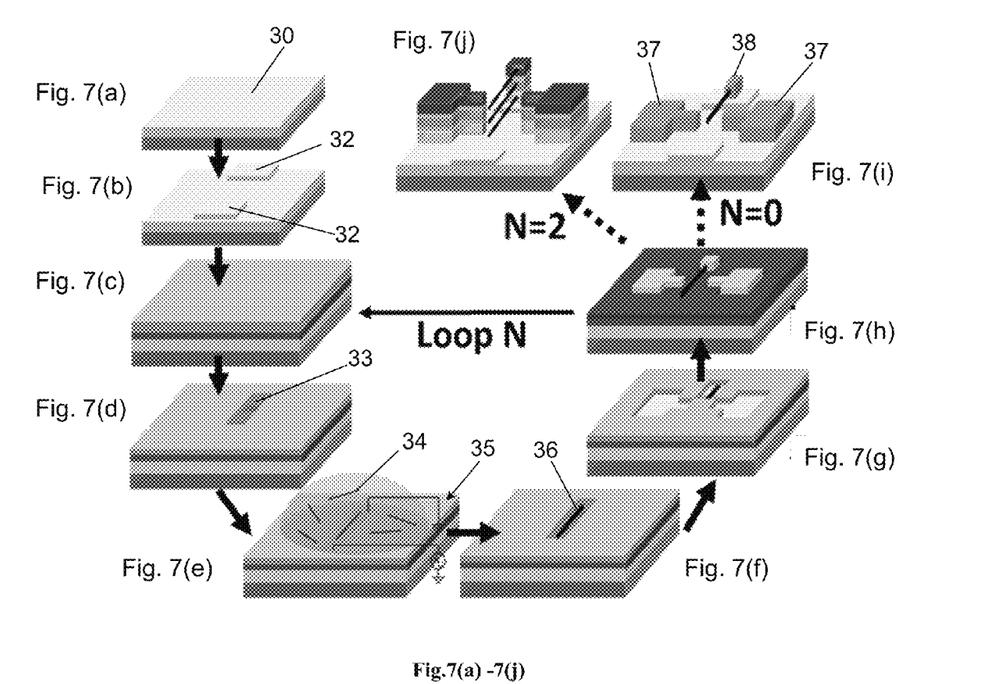

For building 3D multiple layer structures, the processes FIG. 7c-h are repeated as a loop and isolation layers are deposited between each metal layer. The number of stacked device layers depends on the loop numbers. If loop number N=0, 1 layer device can be fabricated (as illustrated in FIG. 7(i), if N=1, two layer devices can be fabricated, as so on for example to form the embodiments of FIGS. 1 to 6 described above. FIG. 7(j) illustrate the result when N=2 and corresponds to the embodiment of FIGS. 1(a)-(b).

The clamped-clamped M-CNT switches are fabricated similarly. Different steps are as follows as an exemplary embodiment:

1) a 50 nm wide trench is defined bridging the guiding electrodes;
2) lateral gates and two clamps on both source/drain electrodes are deposited.

Both types of devices (cantilever and clamped-clamped) were released by stripping the resists and being dried in a critical point drier to avoid the surface tension. Meanwhile, misaligned CNTs and impurities were lifted off (FIG. 7h).

The self-assembled symmetric structures with nanoscale precision ensure the symmetry of the switching behaviors of the M-CNT NEM switches.

Three-terminal CNT NEM switches (see FIG. 2) may be fabricated by the same assembly technique simply by splitting each gate electrode up into two disconnected electrodes (used as gate and drain contacts). They can be assembled during the gate definition and deposition step. In this case, independent control of the gate and drain electrodes can be realized.

Extended Methods of Fabrication

One could also adapt the batch fabrication method to vertical CNT assemblies. The fabrication process is illustrated in FIG. 7(a')-7(f') as an exemplary embodiment.

First, a thick ebeamresist layer 41 (~1 um) is coated on a SiO2/Si substrate 40 with pre-patterned guiding electrode pairs 42 (see FIG. 7a'-b').

Small windows/trenches 43 are defined on top of the resist layer 41 and the exposed resist are dissolved exposing the underlying small regions of the guiding electrodes (see FIG. 7c').

Then, a CNT solution 44 is cast onto the sample surface and ac-dielectrophoresis 45 is applied between the guiding electrodes 42. CNTs are attracted and trapped into the vertical deep trenches 43 (see FIG. 7d').

Typically, one CNT per trench 43 is assembled. Then, electroplating is applied to the guiding electrodes 42, and metal clamps are deposited in the deep trenches connecting the CNTs 46 and the guiding electrodes 42 (see FIG. 7e').

The devices are released by stripping the resists and being dried in a critical point drier to avoid the surface adhesion. Meanwhile, misaligned CNTs 46 and impurities are lifted off (see FIG. 7f').

Finally, vertical CNT arrays with controllable density, location and orientation can be fabricated.

The process and vertically assembled CNTs can be used to fabricate field emission displays, CNT NEM switches (with vertically deposited actuation electrodes or CNTs), vertical CNT field effect transistors (both ends of the vertical CNTs are clamped. Gate dielectrics can be deposited around the CNT channels by ALD, and gate electrode can be deposited finally).

Therefore, with the fabrication methods disclosed above in Section 1.3 and 1.4, devices with horizontal or vertical CNTs can be fabricated with high precision and controllable density.

Moreover, both process flows are applicable not only to CNTs but also other high aspect ratio materials such as: nanowires, grapheme flakes and so on.

2. Advantages and Applications

The 3D M-CNT structures have many applications including: CMOS elements such as CNT field-effect transistor (FET) based logic gates, CNT memories, chemical, optical or displacement sensing applications as well as resonant NEMS devices. The proposed 3D M-CNT devices in the invention offer a CMOS-compatible bottom-up approach for a broad field of potential CMOS and NEMS applications including: NEMS switches, logic devices, memory elements, pulse generators, gap sensors, biosensor with functionalized CNTs, etc., with higher circuit density and novel ultra-scaled configurability functions. Moreover, they allow for higher circuit density and novel ultra-scaled configurability functions. Also, the novel fabrication method offers easy process loop, uniform switching property, and potential for developing new designs.

Other applications of the specific functionality of the M-CNT switches include: ultra-scaled reconfigurable interconnects, delay lines and so on, for logic circuits with robust performance.

They can be used to produce stable and reconfigurable complex logic circuits with very few basic switches. For example, Take the first layer M-CNT switches for example, FIG. 8a shows a customized implementation of a decoder circuit (2×4) 50, involving less number of primitive switches and less active power. FIG. 8b illustrates an embodiment of a specific cross bar switch matrix 51 where only one output is connected to one input at a time.

The proposed 3D M-CNT structures offer ultra-high circuit integration, higher circuit density, low power consumption and low cost.

3. Demonstration of 3D M-CNT Switches and Characteristics

3.1 Demonstration of 3D M-CNT Switches

3.1.1 N=0: One Layer Two-Terminal Cantilever M-CNT Switches

FIG. 9 demonstrates the first layer of a two terminal cantilever M-CNT switch 52.

In the cantilever M-CNT switch, one end of the 500 nm long CNT 1 is fixed leaving the other end suspended. The CNT-lever is suspended between the dual gates (labeled as: 4, 4' in FIG. 10(a) and G/D1 and G/D2 in FIG. 10(b)). The lateral gates are nearly symmetric, 95 nm and 100 nm away from the CNTs in the centerline, respectively. The symmetric structures with nanoscale precision ensure the symmetry of the switching behaviors of the M-CNT NEM switches.

FIG. 9(a) illustrates a 3D structure example, FIG. 9(b) an exemplary layout with the three position (middle, left and right of the CNT 1) and FIG. 9(c) a SEM image of the first layer of the two terminal cantilever M-CNT switches.

The Tri-states for this layer are for example: when CNT 1 is centered, the switch is OFF. When the CNT 1 is at the position to the left, the switch is ON-1; and when it is at the position to the right, the switch is ON-2.

3.1.2 N=0: One Layer Three-Terminal Cantilever M-CNT Switches

FIG. 10 illustrates the first layer of a three terminal cantilever M-CNT switch as described above in relation to FIG. 2.

In the three terminal M-CNT switch, the gate and drain electrodes are separated and the CNT-lever is suspended between the dual gates (labeled as: G1 and G2) and dual drains (Labeled as: D1 and D2), "S" identifying the source.

FIG. 10(a) illustrates a 3D structure example, FIG. 10(b) an exemplary layout and FIG. 10(c) a SEM image of the first layer of the three terminal cantilever M-CNT switch.

3.1.3 N=0: One Layer Two-Terminal Clamped-Clamped M-CNT Switches

Figure 11A:
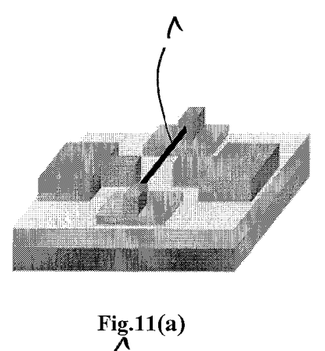
FIG. 11(a) illustrates an embodiment of a 3D structure of a two terminal clamped-clamped M-CNT switches.
Figure 11B:
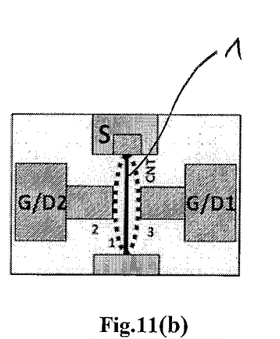
FIG. 11(b) illustrates a exemplary layout of the first layer of a two terminal clamped-clamped M-CNT switches.
Figure 11C:
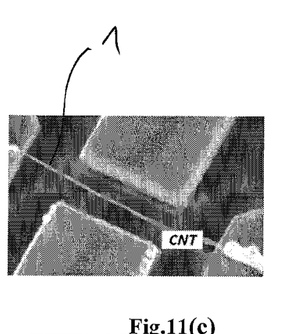
FIG. 11(c) illustrates a SEM image of the first layer of a two terminal clamped-clamped M-CNT switches.

FIG. 11(a) illustrate an embodiment of a 3D structure, FIG. 11(b) a exemplary layout and FIG. 11(c) a SEM image of the first layer of the two terminal clamped-clamped M-CNT switches.

In the clamped-clamped M-CNT switch, both ends of the 1.5 um long CNT 1 are fixed. The CNT beam is suspended between the dual gates (G1/D1, G2/D2).

3.1.4 N=0: One Layer Three-Terminal Clamped-Clamped M-CNT Switches

Figure 11D:
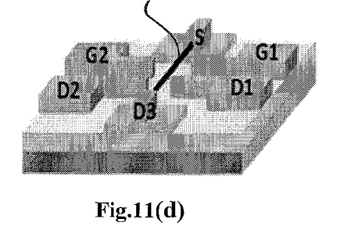
FIG. 11(d) illustrates a possible 3D structure for such switch of the first layer of a three terminal clamped-clamped M-CNT switch.
Figure 11E:
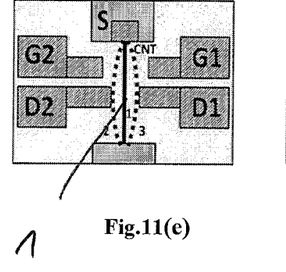
FIG. 11(e) illustrates an exemplary layout of the first layer of a three terminal clamped-clamped M-CNT switch.
Figure 11F:
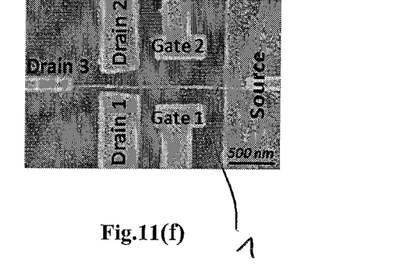
FIG. 11(f) illustrates a SEM image of the first layer of a three terminal clamped-clamped M-CNT switch.

FIG. 11(d) illustrates a possible 3D structure for such switch, FIG. 11(e) an exemplary layout and FIG. 11(f) a SEM image of the first layer of the three terminal clamped-clamped M-CNT switch.

Operating Principles of the M-CNT Switches

We take the two terminal one layer M-CNT switch for example:

The physical operation of a CNT based switch is as follows: when a potential difference is created between the CNT 1 and one of the gates 4-6'; G1/D1, G2/D2, the electrostatic charges induced on both the CNT 1 and the gate give rise to electrostatic forces which deflect the CNT. In addition to electrostatic forces, depending on the gap between the CNT 1 and the lateral gate, Van der Waals forces also act on the tube 1 and deflect it. Counteractively, the elastic forces try to restore the tube 1 to its original straight position. For an applied gate voltage, an equilibrium position of the tube 1 is defined by balance of the three forces. The combined effects of three forces may lead to different switching behaviors depending on different CNT dimensions, CNT stiffness, surface condition and so on. As a result, in our experiment, we found that some CNTs stuck to the electrode and cannot be removed when the gate voltage was reduced to zero (stiction).

Three mechanical states of two-terminal cantilever and clamped-clamped M-CNT NEM switches without stiction are depicted in FIGS. 12 and 13, respectively.

The suspended CNTs 1 initially located in the center, which is defined as "State 1" ("OFF" state). By applying gate voltages to either gate (G1/G2), the suspended CNTs 1 can be actuated and make direct contact to the biased gate. For example, when voltage signal is applied to G1, the CNTs get pulled right (defined as: "State 2", ON state-1); and when voltage signal is applied to G2, CNT will be pulled left (defined as: "State 3", ON state-2). The CNTs will get unstuck and reset back to their initial state ("State 1") by removing gate voltage.

Note that for the M-CNT switches with stiction, the working principle is slightly different: only gate voltage pulses are needed to actuate the CNTs 1. The switches will get reset by applying a resetting voltage pulse between the CNTs 1 and the substrate. For both three-terminal M-CNT switches and two-terminal M-CNT switches with stiction, ultra-low standby and leakage power are guaranteed.

3.2 Characteristics of the M-CNT Switches

One takes the two terminal one layer M-CNT switch embodiment as an example. To validate the basic working principles of the M-CNT switches, we take the simple two-terminal M-CNT switches without stiction as an example.

Corresponding to different mechanical states of the cantilever switches, different current paths in the circuit could be set.

FIG. 14 shows the typical switching characteristics of the cantilever M-CNT NEM device, which is flip-flopping between "State 1"-"State 2" and "State 1"-"State 3". All characterizations were carried out in vacuum at room temperature with source biased. The insets (down) show the ultra-low leakage currents in "OFF" state For both gates, the pull-in currents of the M-CNT NEM switch display three typical regions:
1) in "OFF" state (non-contacting mode), ultra-low source-gate leakage currents of ~$10^{-14}$ A were detected;
2) in short-range non-contact mode, electron emission currents between the CNT tip and the biased gate were observed showing high resistance;
3) in full-contacting mode, source-gate current increased abruptly at $V_{G1}$=9.48 V for "State 1"-to-"State 2" or $V_{G2}$=8.80 V for "State 1"-to-"State 3", when the CNT tip physically contacted the gate. $V_{G1}$ and $V_{G2}$ are defined as $V_{pull-in1}$ and $V_{pull-in2}$.

Excellent on-off current ratios up to $10^7$ were observed. Similar characteristics were found in the pull-out currents. Substantial hysteresis exits, since the magnitude of the interatomic forces (the van der Waals and short-range forces) are comparable to those of the elastic and electrostatic forces when the CNT approaches the gate electrode. It can be advantageous for developing non-volatile CNT NEM memory elements. The effects of the environment on our switches as well as the endurance characteristics were investigated.

Results for a typical device are shown in FIG. 15. Compared with the electrical characteristics measured immediately after being fabricated, pull-in voltage of the cantilever M-CNT switch only degraded by 0.5V (~5%) after over 100 operating cycles. Moreover, the $V_{pull-in}$ degradation remained acceptable even after we exposed the switch in air without any passivation treatment at room temperature for 3 weeks. The M-CNT NEM switch was proved to be robust and stable.

Further process such as annealing can be added to improve the CNT-metal contacts. Therefore, the operation power and lifetime can be greatly improved.

Good isolation of the cantilever M-CNT switch in "OFF state" has been verified by HFSS simulation up to 10 GHz as shown in FIG. 16.

The mechanical states of the prototype of a clamped-clamped M-CNT switch are depicted in FIG. 13. It operates similarly with the cantilever M-CNT switch.

FIG. 17 displays the actuation measurement of the clamped-clamped M-CNT switch while switching from "State 1" to "State 2". A sharp current onset was observed with $I_{on}/I_{off}$ up to $10^6$, exhibiting excellent switching performance. Note that current path is set only when the middle section of the suspended CNT body makes physical contact with the gate electrode. Thus, electron emission current has been eliminated and abrupt switching has been obtained.

The present description provides exemplary embodiments and is not intended to limit the scope, applicability, or configuration of the claims. Rather, the present description will provide those skilled in the art with an enabling description for implementing the described embodiments. It being understood that various changes may be made in the function and arrangement of elements without departing from the spirit and scope of the appended claims.

In addition, the examples and values given above are only for illustrative purposes and should not be construed in a limiting manner. Different embodiments of the invention may be combined together according to circumstances. In addition, other embodiments and applications may be envisaged for example by using equivalent means

The invention claimed is:

1. A method for producing a 3D CNT structure, wherein the method comprises the following steps:
   (a) a photoresist is coated on a substrate with pre-patterned guiding electrode pairs;
   (b) trenches are defined between each guiding electrode pair,
   (c) a CNT solution is cast onto the sample surface and ac-dielectrophoresis 35 is applied between the guiding electrodes such that CNTs are attracted and trapped into the trenches;
   (d) a further ebeamresist layer is coated;
   (e) lateral gates and CNT clamp on top of the source electrode are defined by EBL and deposited by metal evaporation;
   (f) the structure is released by stripping the resist and dried to avoid surface tension.

2. The method of claim 1, wherein steps (a) to (e) are repeated a predetermined number of times.

3. The method of claim 1 used fabricate field emission displays, CNT NEM switches (with vertically deposited actuation electrodes or CNTs), vertical CNT field effect transistors.

4. The method of claim 1, wherein it is applied to nanowire or graphene flakes.

5. The method of claim 2, wherein the predetermined number of times is equal to 0, 1, 2 or more.

6. A method for producing a vertical 3D CNT structure, wherein the method comprises the following steps
   (a) a thick ebeamresist layer is coated on a substrate with pre-patterned guiding electrode pairs;
   (b) small windows or trenches are defined on top of the resist layer and the exposed resist is be dissolved exposing underlying small regions of the guiding electrodes;
   (c) a CNT solution is cast onto the sample surface and ac-dielectrophoresis is applied between the guiding electrodes such that CNTs are attracted and trapped into the vertical deep trenches;
   (d) electroplating is applied to the guiding electrodes and metal clamps are deposited in the deep trenches connecting the CNTs and the guiding electrodes;
   (e) the structures are released by stripping the resists and being dried in a critical point drier to avoid the surface adhesion;
   (f) misaligned CNTs and impurities are lifted off.

7. The method of claim 6, wherein it is applied to nanowire or graphene flakes.

* * * * *